US006965234B1

(12) United States Patent
Cunningham et al.

(10) Patent No.: US 6,965,234 B1
(45) Date of Patent: Nov. 15, 2005

(54) RF PULSES WITH BUILT-IN SATURATION SIDEBANDS FOR MRI APPLICATIONS

(75) Inventors: Charles H. Cunningham, San Francisco, CA (US); Juan M. Santos, Stanford, CA (US); John M. Pauly, Redwood City, CA (US); Graham Arnold Wright, Toronto (CA); Jeffrey Alan Stainsby, Toronto (CA); John Andrew Derbyshire, Silver Spring, MD (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 58 days.

(21) Appl. No.: 10/960,212

(22) Filed: Oct. 6, 2004

(51) Int. Cl.[7] .............................................. G01V 3/00
(52) U.S. Cl. ...................................... 324/314; 324/300
(58) Field of Search ................................ 324/314, 312, 324/300, 306, 307, 309

(56) References Cited

U.S. PATENT DOCUMENTS 4,940,940 A 7/1990 Leroux
5,235,280 A * 8/1993 Deimling .................... 324/314
5,821,752 A * 10/1998 LeRoux ...................... 324/314
6,028,428 A 2/2000 Cunningham
6,853,192 B2 * 2/2005 Heid .......................... 324/314

OTHER PUBLICATIONS

Cunningham et al., "*RF Pulses with Built-In Saturation Sidebands*", International Society for Magnetic Resonance in Medicine, May 2004, 1 Page.

* cited by examiner

*Primary Examiner*—Louis Arana
(74) *Attorney, Agent, or Firm*—Beyer Weaver & Thomas LLP

(57) ABSTRACT

A RF Excitation pulse for MRI applications has built-in saturation sidebands, thereby reducing the time for an excitation sequence. The pulse is created using the Shinnar-Le Roux (SLR) transform and designing beta-polynomials for a desired image slice excitation and for saturation of RF excitation such as by de-phasing in regions adjacent to the desired image slice. The beta-polynomials are combined and an inverse SLR transform creates the RF pulse from the combined beta-polynomial.

22 Claims, 2 Drawing Sheets

RF PULSES WITH BUILT-IN SATURATION SIDEBANDS FOR MRI APPLICATIONS

GOVERNMENT RIGHTS

The U.S. government has rights in the disclosed invention pursuant to NIH grants to Stanford University including NIH-R01HL074332 and NIH-R01HL067161.

BACKGROUND OF THE INVENTION

This invention relates generally to magnetic resonance imaging (MRI), and more particularly the invention relates to RF excitation pulses as used in MRI.

Magnetic resonance imaging (MRI) is a non-destructive method for the analysis of materials and for medical imaging. It is generally non-invasive and does not involve ionizing radiation. In very general terms, nuclear magnetic moments are excited at specific spin precession frequencies which are proportional to the local magnetic field the radio frequency signals resulting from the precession of the spins are received using pickup coils. By manipulating the magnetic fields, an array of signals is provided representing different regions of the volume. These are then combined to produce a volumetric image of the nuclear spin density of the body.

MRI signals for recording an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins.

In auto-triggered MR angiography of intra-cranial arteries, arteries are monitored with a real-time pulse sequence and the signal statistics are used to automatically detect the arrival of a bolus of contrast agent, triggering an instantaneous switch to a high-resolution 3D acquisition (See Farb et al.,"Intracranial arteriovenous malformations: real-time auto-triggered elliptic centric-ordered 3D gadolinium-enhanced MR angiography—initial assessment.", Radiology 220:244–251, 2001.) The signal variation due to in-flow is a source of uncertainty. RF saturation pulses can be applied adjacent to the imaging slice prior to each data acquisition to reduce in-flow enhancement, but this typically requires a longer repetition time (TR) and a loss in temporal resolution. Temporal resolution is an issue in applications such as intracranial MR angiography because the transit time from the arterial to the venous system is short and precise timing minimizes venous contamination.

RF saturation pulses are used in MRI to suppress unwanted signals. These pulses are typically implemented as a 90-degree, slice-selective excitation followed by a dephasing "crusher" gradient pulse. However, this takes several milliseconds, increasing the minimum repetition time (TR) for rapid pulse sequences, and decreasing flexibility for other, longer TR sequences.

SUMMARY OF THE INVENTION

The present invention enables a single RF pulse to accomplish both excitation of the imaging slice as well as saturation of adjacent regions, thereby reducing the minimum repetition times and improving temporal resolution and efficiency.

The invention is implemented using the Shinnar-Le Roux (SLR) transform. Se Le-Roux U.S. Pat. No. 4,940,940; Pauly, Le Roux, Nishimura, Macovski "Parameter relations for the Shinnar-Le Roux selective excitation pulse design algorithm", IEEE TMI 10:53–65 (1991).

The SLR transform maps the RF pulse waveform to two polynomials, commonly called alpha and beta. It is useful because the beta-polynomial is related to the excitation profile through a linear transform (the Fourier transform). Because of the linear relationship between the beta-polynomial and the excitation profile, the beta-polynomial for the new RF pulses can be created by designing separate beta-polynomials for a saturation pulse and for an excitation pulse, and then summing the two polynomials.

The invention and objects and features thereof will be more readily apparent from the following detailed description and appended claims when taken with the drawings.

BRIEF DESCRIPTION OF THE DRAWINGS

FIGS. 3*a*–3*b* illustrate images of cavernous carotid arteries obtained with an RF pulse with saturation bands turned off and with the saturation bands turned on.

DETAILED DESCRIPTION

Normally, the signal enhancement due to freshly magnetized blood flowing into the imaging slice is a desirable effect in MR angiography. However, when the goal is to detect the arrival of a bolus of gadolinium-DTPA, the signal variation due to in-flow is a source of uncertainty. This is a particular issue in applications such as auto-triggered MR angiography where the statistics of the signal are used to automatically determine contrast arrival. RF saturation pulses can be applied adjacent to the imaging slice prior to each data acquisition to reduce in-flow enhancement, but this typically requires a longer TR and a loss in temporal resolution. Temporal resolution is an issue in applications such as intracranial MR angiography where the transit time from the arterial to the venous system is short and precise timing minimizes venous contamination. Following is the design and implementation of RF pulses that simultaneously excite a slice and de-phased saturation slabs, allowing a reduced TR, in accordance with one embodiment of the invention.

The Shinnar-Le Roux (SLR) transform, supra, maps the sampled RF pulse waveform to two polynomials, commonly called alpha and beta. The SLR transform is useful because beta is related to the excitation profile by the Fourier transform. Because of this linear relationship, the dual-purpose pulse described below can be created by designing separate beta-polynomials for a saturation pulse and an excitation pulse, and simply summing them together.

The beta-polynomial for the saturation bands can be designed with the Parks-McLellen (PM) digital filter design algorithm using a time-bandwidth product (TB) of 8 and a linear-phase design. This algorithm is discussed in Rabiner and Gold, Theory and Application of Digital Signal Processing, Prentice-Hall, 1975. Non-linear phase was created across the saturation band by computing the complex roots of the beta-polynomial, and flipping a subset of the passbands roots across the unit circle. The beta-polynomial for the slice excitation was designed with the PM algorithm using a TB of 3.5 and a minimum phase design. These two beta-polynomials were then combined with the steps shown in FIG. 1.

FIG. 1(*a*) illustrates a Beta-polynomial for the saturation (sat) band resulting from the root-flipping process. To move the sat band adjacent to the imaging slice, the beta-polynomial in (a) is modulated by a complex exponential, and the imaginary part is discarded (b). This creates two sat bands, one on either side of the imaging slice; for a pulse that excites only one sat band, the imaginary part is retained. The beta-polynomials for the sat band and the imaging slice are padded with zeros to further de-phase the sat band (c). Finally, the two polynomials in are summed (d).

Figure 1A:
FIGS. 1*a*–1*d* illustrate RF pulse formation with built in saturation sidebands by summing SLR beta-polynomials in accordance with the invention.
Figure 1B:
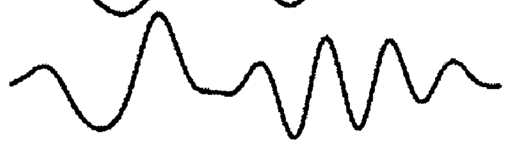
Figure 1C:
Figure 1D:
Figure 2A:
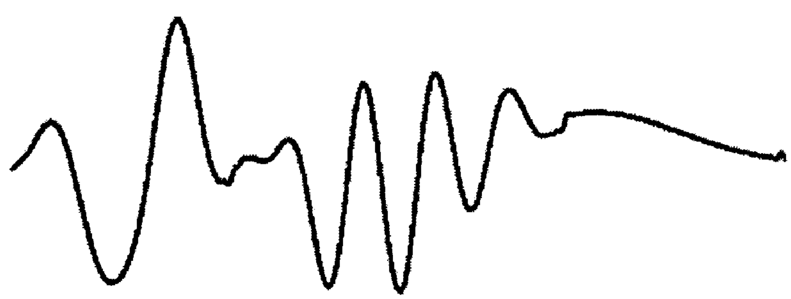
FIGS. 2*a*–2*b* illustrate the RF pulse of FIG. 1*d* after inverse SLR transform, and the excitation profile from the RF pulse.
Figure 2B:
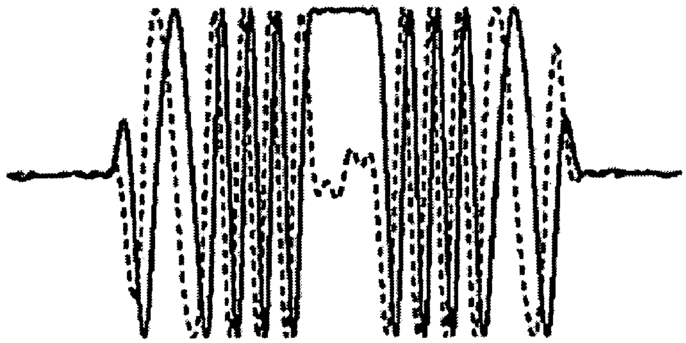
Figure 3A:
Figure 3B:

The inverse SLR transform was then used to compute the RF pulses (see FIG. 2). FIG. 2 illustrates the RF pulse with built-in saturation sidebands. (a) The RF waveform was 3.1 ms in duration, with a peak amplitude of 25 uT. (b) The profile excited by this pulse consists of a 5 mm slice in the center, and de-phased saturation bands that extend +/−16 mm from the slice.

The new RF pulses were implemented in an auto-triggered 3D MRA acquisition sequence and compared to the conventional RF saturation method. Images of volunteers were acquired on a 1.5 T GE Signa using a standard head coil. An axial slice containing the cavernous carotid arteries and some portion of the large dural venous sinuses was chosen in accordance with our clinical auto-triggered protocol. Saturation bands were turned on and off via a real-time interactive interface designed for the auto-triggered studies. The conventional saturation bands were achieved through the application of separate RF excitations and gradient spoilers for the superior and inferior bands followed by a standard gradient echo acquisition. With the new pulses, the excitation pulse was changed based on the desired saturation band(s), with the pulse-sequence timing unchanging. Saturation bands were applied every TR to achieve maximal blood suppression.

The time to acquire each 256×128 image was measured and was approx. 0.8 sec/image without saturation bands (and with saturation bands using the new RF pulses). With the conventional saturation method, this increased to approx. 1.5 sec/image with one saturation pulse, and to 2.2 sec/image with both superior and inferior saturation bands. This corresponds to a 275% increase in temporal resolution using the new pulses. Also, for intracranial MRA where the transit time between arterial and venous systems is about 8 s, this increase in temporal resolution will give up to 1.4 s of extra imaging time. Signal levels from one of the cavernous carotid arteries and the large dural sinus are compared in table 1. We were able to achieve comparable levels of vascular signal suppression while avoiding the large increase in background signal levels that occurs with the conventional method due to increased TR.

TABLE 1

| | Artery | Vein | Tissue |
|---|---|---|---|
| New | 35.9% | 35.0% | 87.2% |
| Old | 38.1% | 16.9% | 137.5% |

Table 1 lists signal levels following the application of superior and inferior RF saturation bands (percent of signal with no saturation). Note that incomplete (30–40%) saturation is desired so that some steady state is achieved in the monitoring sequence as in the high-resolution angiography sequence.

In rapid imaging sequences, with a short repetition time (TR), suppression of unwanted signal by de-phasing can be complicated by the stimulated echoes that can form. This process leads to signal contamination from the unwanted regions. To stop these coherence pathways from forming for the saturation bands, but allowing them for the imaging slice, there are several possibilities, as follows.

The zeroth-order phase of the saturation bands relative to the imaging slice can be randomly changed from TR to TR. This can be implemented by designing a series of RF pulses, with a range of phase shifts between the saturation bands and the imaging slice, and randomly switching between pulses each TR.

An alternative method to suppress the coherence pathways is to change the amplitude of the slice-select gradient slightly (1–2 percent) each TR. If this change in amplitude is randomized, the phase at any-particular spatial location within the saturation bands will also be random from TR to TR, and coherence pathways will not form. This same effect can also be accomplished by spatially translating the profile back and forth by a small amount each TR (i.e. jiggling the profile).

Following are three illustrative design sequences for the RF pulse in accordance with the invention:

Option 1

- design beta-polynomial for single saturation band with Parks-McLellen algorithm
- modulate by complex exponential to move saturation band to location adjacent to imaging slice
- (discard imaginary component to create saturation bands on both sides of imaging slice)
- design beta-polynomial for imaging slice and pad with zeros on one end
- pad the beta-polynomial for the saturation band(s) with zeros on the opposite end
- sum the beta-polynomials for the saturation bands and the imaging slice
- apply the inverse 1D SLR transform to create the RF pulse Option 2

- design beta-polynomial for single saturation band with Parks-McLellen algorithm
- modulate by complex exponential to move saturation band to location adjacent to imaging slice
- (discard imaginary component to create saturation bands on both sides of imaging slice)
- multiply coefficients by exp(i*pi*(n−1)/N) where N is the total number of different pulses to be created, and n enumerates the current pulse
- design beta-polynomial for imaging slice and pad with zeros on one end
- pad the beta-polynomial for the saturation band(s) with zeros on the opposite end
- sum the beta-polynomials for the saturation bands and the imaging slice
- apply the inverse 1D SLR transform to create the RF pulse
- repeat N times, incrementing n from 1 to N, to create N different pulses Option 3

- design beta-polynomial for single saturation band with Parks-McLellen algorithm
- perform “root-flipping” to create non-linear phase across saturation band
- modulate by complex exponential to move saturation band to location adjacent to imaging slice (discard imaginary component to create saturation bands on both sides of imaging slice)

multiply coefficients by exp(i*pi*(n−1)/N) where N is the total number of different pulses to be created, and n enumerates the current pulse design beta-polynomial for imaging slice and pad with zeros on one end pad the beta-polynomial for the saturation band(s) with zeros on the opposite end sum the beta-polynomials for the saturation bands and the imaging slice apply the inverse 1D SLR transform to create the RF pulse repeat N times, incrementing n from 1 to N, to create N different pulses In summary, we have designed and implemented new RF pulses with built-in saturation sidebands. We have demonstrated the concept with pulses designed for triggered Gd-MRA studies, but similar pulses may be useful for other applications such as peripheral angiography and coronary artery imaging. Using the new pulses afforded a 275% increase in temporal resolution. This will allow for more accurate detection of contrast arrival.

While the invention has been described with reference to specific embodiments, the description is illustrative of the invention and not limiting the invention. Various applications may occur to those skilled in the art without departing from the spirit and scope of the invention as defined by the appended claims.

What is claimed is:

1. A method for creating a RF pulse with built-in saturation sidebands for use in magnetic resonance imaging (MRI) applications, said method comprising the steps of:

(a) using Shinnar-Le Roux (SLR) transform, design a first beta-polynomial for desired image slice excitation, (b) using the SLR transform, design a second beta-polynomial for saturation of RF excitation in regions adjacent to the desired image slice, (c) combining the first beta-polynomial and the second beta-polynomial, and (d) applying an inverse SLR transform to the combined beta-polynomials to create the RF pulse.

2. The method of claim 1 wherein steps (a) and (b) utilize a Parks-McLellen (PM) digital filter design algorithm.

3. The method of claim 2 wherein the PM algorithm utilizes specific time-bandwidth products.

4. The method of claim 3 wherein step (a) uses a minimum phase design and step (b) uses a linear-phase design.

5. The method of claim 4 wherein suppression of unwanted signal from adjacent regions includes de-phasing in the regions adjacent to the desired image slice.

6. The method of claim 5 wherein zeroth-order phase of the saturation bands relative to the imaging slice is randomly changed in repetition times (TR).

7. The method of claims 6 wherein a series of RF pulses are designed with a range of phase shifts between saturation bands and the imaging slice, and randomly switching between pulses for each TR.

8. The method of claim 5 wherein amplitude of a slice-select gradient is changed each repetition time (TR).

9. The method of claim 5 wherein slice profile is spatially translated each repetition time (TR).

10. The method of claim 1 wherein suppression of unwanted signal from adjacent regions includes de-phasing in the regions adjacent to the desired image slice.

11. The method of claim 10 wherein zeroth-order phase of the saturation bands relative to the imaging slice is randomly changed in repetition times (TR).

12. The method of claim 11 wherein a series of RF pulses are designed with a range of phase shifts between saturation bands and the imaging slice and randomly switching between pulses for each TR.

13. The method of claim 10 wherein amplitude of a slice-select gradient is changed each repetition time (TR).

14. The method of claim 10 wherein slice profile is spatially translated each repetition time (TR).

15. The method of claim 10 wherein steps (a) and (b) utilize a FIR filter design algorithm.

16. The method of claim 1 wherein steps (a) and (b) utilize a FIR filter design algorithm.

17. The method of claim 16 wherein step (a) uses a minimum phase design and step (b) uses a linear-phase design.

18. The method of claim 17 wherein suppression of unwanted signal from adjacent regions includes de-phasing in the regions adjacent to the desired image slice.

19. The method of claim 18 wherein zeroth-order phase of the saturation bands relative to the imaging slice is randomly changed in repetition times (TR).

20. The method of claim 19 wherein a series of RF pulses are designed with a range of phase shifts between saturation bands and the imaging slice, and randomly switching between pulses for each TR.

21. The method of claim 18 wherein amplitude of a slice-select gradient is changed each repetition time (TR).

22. The method of claim 18 wherein slice profile is spatially translated each repetition time (TR).

* * * * *